US011798966B2

United States Patent
Shiota et al.

(10) Patent No.: US 11,798,966 B2
(45) Date of Patent: Oct. 24, 2023

(54) LIGHT RAY DIRECTION CONTROL ELEMENT, MANUFACTURING METHOD FOR LIGHT RAY DIRECTION CONTROL ELEMENT, AND IMAGING ELEMENT

(71) Applicants: TIANMA JAPAN, LTD., Kanagawa (JP); Wuhan Tianma Micro-Electronics Co., Ltd., Wuhan (CN)

(72) Inventors: Kunihiro Shiota, Kanagawa (JP); Ken Sumiyoshi, Kanagawa (JP); Hiroshi Haga, Kanagawa (JP)

(73) Assignees: TIANMA JAPAN, LTD., Kanagawa (JP); Wuhan Tianma Micro-Electronics Co., Ltd., Wuhan (CN)

( * ) Notice: Subject to any disclaimer, the term of this patent is extended or adjusted under 35 U.S.C. 154(b) by 230 days.

(21) Appl. No.: 17/126,354

(22) Filed: Dec. 18, 2020

(65) Prior Publication Data
US 2021/0202556 A1    Jul. 1, 2021

(30) Foreign Application Priority Data

Dec. 26, 2019 (JP) ................ 2019-236033
Sep. 15, 2020 (JP) ................ 2020-154516

(51) Int. Cl.
*H01L 27/146* (2006.01)
*G02B 5/00* (2006.01)

(52) U.S. Cl.
CPC ........ *H01L 27/14625* (2013.01); *G02B 5/003* (2013.01)

(58) Field of Classification Search
CPC ......... H01L 27/14625; H01L 31/02168; H01L 27/14; H01L 27/146; H01L 27/148; H01L 27/14806; H01L 31/02; H01L 31/0216; G02B 5/003; G02B 5/20; G02B 5/22; G02B 5/26; G02B 5/28; G02B 5/30; G02B 6/24; G02B 6/42; G02B 6/04
USPC ........................................ 257/437
See application file for complete search history.

(56) References Cited

U.S. PATENT DOCUMENTS

| | | | |
|---|---|---|---|
| 2003/0214695 A1* | 11/2003 | Abramson | G02F 1/1516 359/265 |
| 2007/0139765 A1* | 6/2007 | Daniel | G02B 6/08 385/116 |
| 2011/0043921 A1* | 2/2011 | Kashiwagi | B29D 11/0074 427/162 |
| 2015/0276995 A1* | 10/2015 | Nomura | G02B 5/003 359/885 |
| 2016/0077363 A1* | 3/2016 | Shiota | G02F 1/1676 349/61 |
| 2016/0363673 A1* | 12/2016 | Ahn | H01L 27/14663 |
| 2017/0010516 A1* | 1/2017 | Shiota | G02F 1/133602 |
| 2019/0250482 A1* | 8/2019 | Shiota | G02F 1/16755 |
| 2021/0066369 A1* | 3/2021 | Do | H01L 27/14625 |

* cited by examiner

*Primary Examiner* — Herve-Louis Y Assouman
(74) *Attorney, Agent, or Firm* — Sughrue Mion, PLLC

(57) ABSTRACT

A light ray direction control element includes a base, a plurality of light transmitting layers arranged on a main surface of the base, a light absorbing layer disposed among the plurality of light transmitting layers, and a tilt prevention layer provided on the main surface of the base and disposed on an outer periphery of a region in which the plurality of light transmitting layers is disposed.

12 Claims, 21 Drawing Sheets

LIGHT RAY DIRECTION CONTROL ELEMENT, MANUFACTURING METHOD FOR LIGHT RAY DIRECTION CONTROL ELEMENT, AND IMAGING ELEMENT

CROSS-REFERENCE TO RELATED APPLICATION

This application claims the benefit of Japanese Patent Application No. 2019-236033, filed on Dec. 26, 2019, and Japanese Patent Application No. 2020-154516, filed on Sep. 15, 2020, of which the entirety of the disclosures is incorporated by reference herein.

FIELD

The present disclosure relates generally to a light ray direction control element, a manufacturing method for the light ray direction control element, and an imaging element.

BACKGROUND

Light ray direction control elements that control the direction of transmitted light are known. For example, U.S. Patent Application Publication No. 2007/0139765 describes a collimating screen including a substrate, a plurality of transparent columns formed in a predetermined pattern on the substrate, and a light absorbing material disposed among the transparent columns. With this collimating screen, the light absorbing material absorbs incident light for which the incident angle is great and, as such, it is possible to control, to within a predetermined range, the exit angle of emitted light exiting the collimating screen.

In U.S. Patent Application Publication No. 2007/0139765, transparent columns that have a high aspect ratio are formed in the predetermined pattern and, then, the light absorbing material is filled among the transparent columns. In cases in which transparent columns are formed on a substrate, the aspect ratio of the transparent columns is high and, as such, the transparent columns formed on the periphery of the predetermined pattern may tilt toward the outside of the predetermined pattern.

SUMMARY

A light ray direction control element according to a first aspect includes:
a base;
a plurality of light transmitting layers arranged on a main surface of the base;
a light absorbing layer disposed among the plurality of light transmitting layers; and
a tilt prevention layer provided on the main surface of the base and disposed on an outer periphery of a region in which the plurality of light transmitting layers is disposed.

A manufacturing method for a light ray direction control element according to a second aspect includes:
laminating, on a main surface of a base, a photosensitive light transmitting material;
forming, from the light transmitting material, an arranged plurality of light transmitting layers, and a tilt prevention layer disposed on an outer periphery of a region in which the plurality of light transmitting layers is disposed; and forming a light absorbing layer among the plurality of light transmitting layers.

An imaging element according to a third aspect includes:
a substrate;
a plurality of light receivers that is arranged on a main surface of the substrate and that receives light from an imaging subject;
a light transmitting layer disposed on each of the plurality of light receivers;
a light absorbing layer disposed among the light transmitting layers; and
a tilt prevention layer provided on the main surface of the substrate and disposed on an outer periphery of a region in which the light transmitting layers are disposed.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

Hereinafter, light ray direction control elements according to embodiments are described while referencing the drawings.

Embodiment 1

Figure 1:
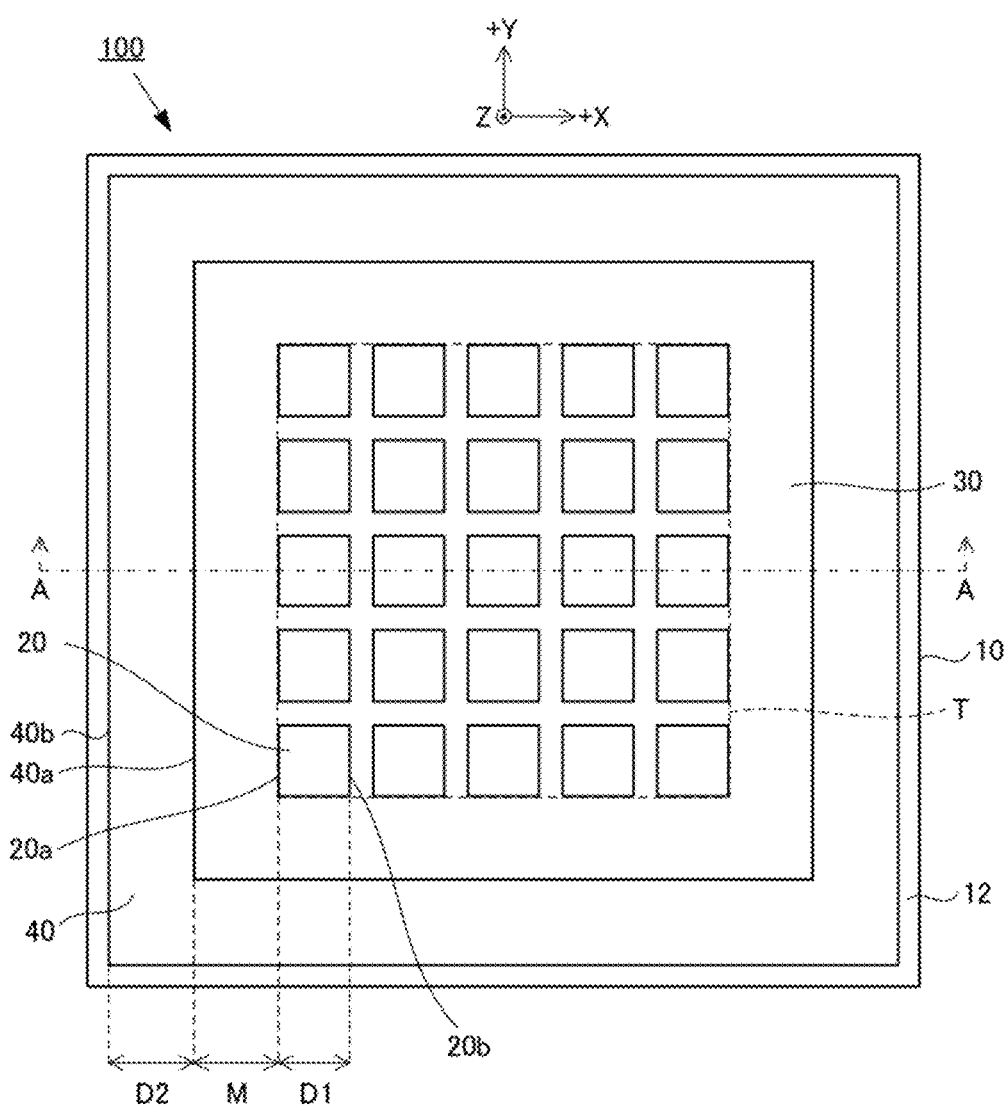
FIG. 1 is a schematic drawing illustrating an upper surface of a light ray direction control element according to Embodiment 1.
Figure 2:
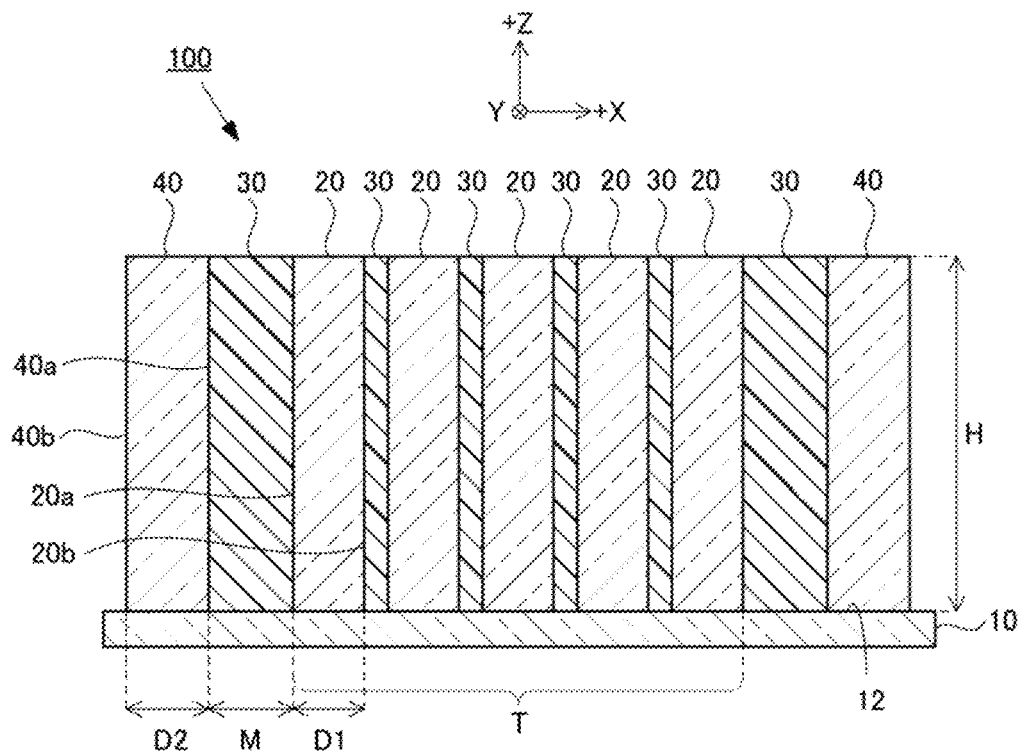
FIG. 2 is a cross-sectional view of the light ray direction control element depicted in FIG. 1, taken along line A-A.

A light ray direction control element 100 according to the present embodiment is described while referencing FIGS. 1 to 6. As illustrated in FIGS. 1 and 2, the light ray direction control element 100 includes a base 10, light transmitting layers 20, a light absorbing layer 30, and a tilt prevention layer 40. In the present embodiment, the base 10 is a light transmitting substrate. The light transmitting layers 20 are arranged in a predetermined pattern on a main surface 12 of the base 10. The light absorbing layer 30 is disposed among the light transmitting layers 20. The tilt prevention layer 40 is disposed on the outer periphery of the predetermined pattern of the light transmitting layers 20. Note that, in the present description, to facilitate comprehension, for the light ray direction control element 100 of FIG. 1, the right direction (the right direction on paper) is referred to as the "+X direction", the up direction (the up direction on paper) is referred to as the "+Y direction", and the direction perpendicular to the +X direction and the +Y direction (the front direction on paper) is referred to as the "+Z direction."

Figure 3:
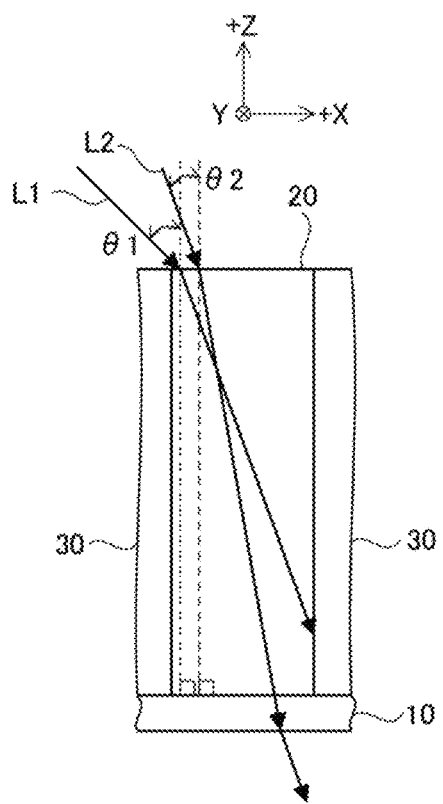
FIG. 3 is a schematic drawing for explaining an angle distribution of transmitting light according to Embodiment 1.

The light ray direction control element 100 is provided in a display surface of a display device (for example, a liquid crystal display), a light receiving surface of an imaging element, or the like. The light ray direction control element 100 controls the angle distribution of transmitting light (that is, light exiting the light ray direction control element 100). Specifically, as illustrated in FIG. 3, of the incident light on the light ray direction control element 100, incident light L1 that has a large incident angle θ1 is absorbed by the light absorbing layer 30. However, of the incident light on the light ray direction control element 100, incident light L2 that has a small incident angle θ2 is not absorbed by the light absorbing layer 30. Accordingly, the incident light L2 that has the small incident angle θ2 transmits through the light ray direction control element 100 (the light transmitting layers 20). Thus, the angle distribution of light that transmits through the light ray direction control element 100 is controlled. The angle distribution of transmitting light can be controlled by a height H of the light transmitting layers 20, a width D1 of the light transmitting layers 20, a refractive index of the light transmitting layers 20, and the like.

In FIG. 1, the base 10 of the light ray direction control element 100 transmits visible light. In one example, the base 10 is implemented as a flat plate-like glass substrate. As illustrated in FIG. 2, the light transmitting layers 20, the light absorbing layer 30, and the tilt prevention layer 40 are formed on the main surface 12 of the base 10.

The light transmitting layers 20 of the light ray direction control element 100 transmit visible light. As illustrated in FIGS. 1 and 2, the light transmitting layers 20 are formed on the main surface 12 of the base 10. The light transmitting layers 20 are formed in a pillar shape from a photosensitive light transmitting material. An aspect ratio (height H/width D1) of the pillar shape light transmitting layers 20 is preferably 1 or greater and more preferably 8 or greater. The light transmitting layers 20 are arranged in a predetermined pattern on the main surface 12 of the base 10. In the present embodiment, the light transmitting layers 20 are formed in rectangular pillars from a chemically amplified photoresist called SU-8 (product name, Nippon Kayaku Co., Ltd.). The light transmitting layers 20 of the present embodiment are arranged in a matrix.

The light absorbing layer 30 of the light ray direction control element 100 is formed on the main surface 12 of the base 10. As illustrated in FIGS. 1 and 2, the light absorbing layer 30 is disposed among the light transmitting layers 20. In the present embodiment, the light absorbing layer 30 and the light transmitting layers 20 are arranged in an alternating manner. The light absorbing layer 30 is formed from a black curable resin, for example, at the same height as the light transmitting layers 20.

The tilt prevention layer 40 of the light ray direction control element 100 suppresses the light transmitting layers 20 from tilting toward the outside of the predetermined pattern. The tilt prevention layer 40 is formed on the main surface 12 of the base 10. Additionally, the tilt prevention layer 40 is disposed on an outer periphery of a region T in which the light transmitting layers 20 are disposed. In the present description, "outer periphery of the region T" refers to the area around the outer side of the region T.

In the present embodiment, the tilt prevention layer 40 is formed from a photosensitive light transmitting material (for example, SU-8), to the same height as the light transmitting layers 20. Additionally, as illustrated in FIG. 1, the tilt prevention layer 40 is formed in a frame shape on the outer periphery of the region T in which the light transmitting layers 20 are disposed. In one example, a spacing M between the tilt prevention layer 40 and the region T is 150 μm.

A width D2 of the tilt prevention layer 40 is preferably wider than a width D1 of one of the light transmitting layers 20. Such a configuration makes it possible for the tilt prevention layer 40 to suppress tilting of the light transmitting layers 20 to a greater degree. In the present description, the "width D1 of one of the light transmitting layers 20" refers to the width (distance) between a surface 20a of a light transmitting layer 20 facing the tilt prevention layer 40 and a surface 20b of a side of the light transmitting layer 20 opposite the surface 20a facing the tilt prevention layer 40. The "width D2 of the tilt prevention layer 40" refers to the width (distance) between a surface 40a of the tilt prevention layer 40 facing the light transmitting layers 20 and a surface 40b of a side of the tilt prevention layer 40 opposite the surface 40a facing the light transmitting layers 20.

Figure 4:
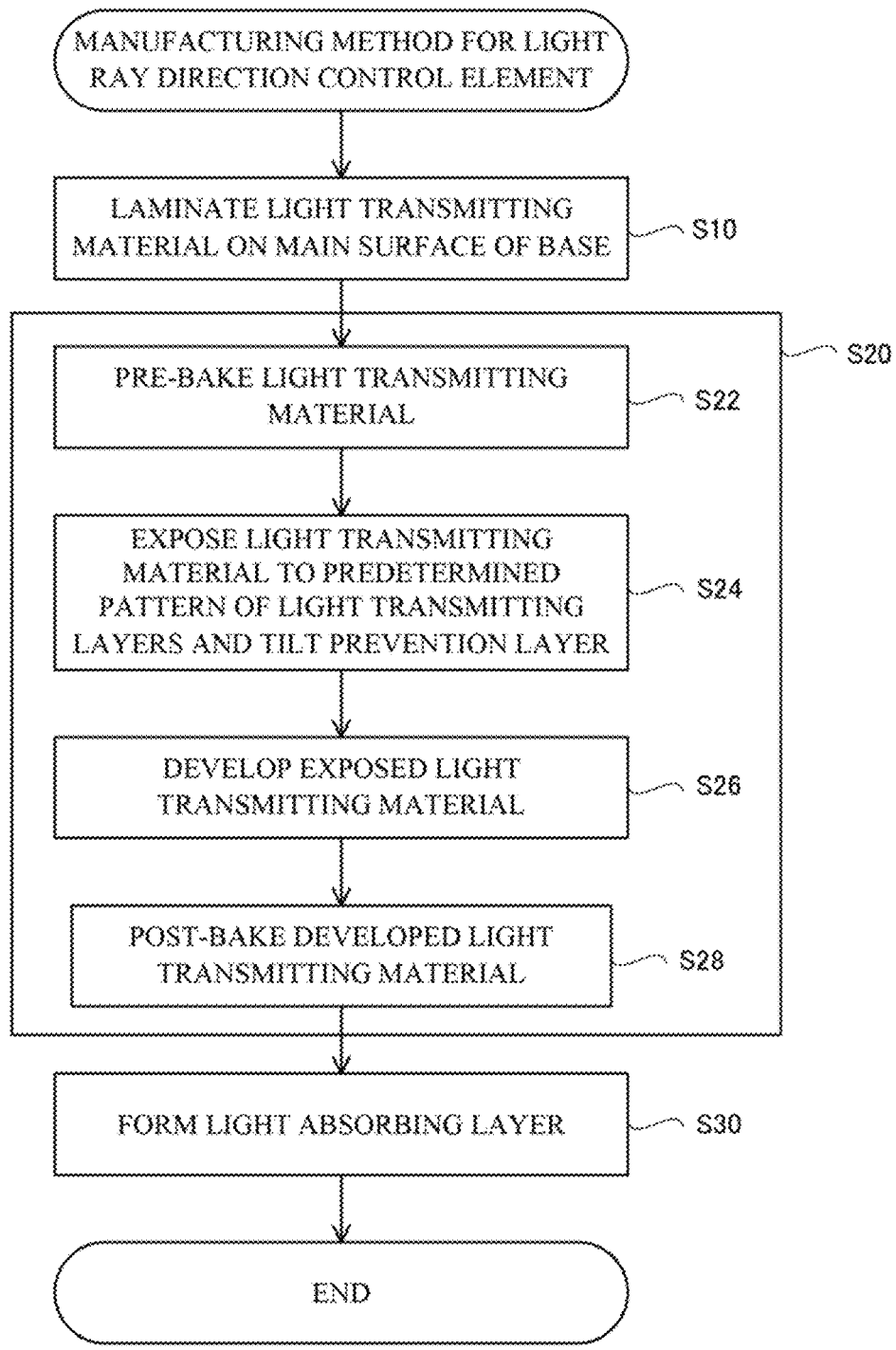
FIG. 4 is a flowchart illustrating a manufacturing method for the light ray direction control element according to Embodiment 1.

Next, a manufacturing method for the light ray direction control element 100 is described while referencing FIG. 4. FIG. 4 is a flowchart illustrating the manufacturing method for the light ray direction control element 100. The manufacturing method for the light ray direction control element 100 includes laminating a photosensitive light transmitting material 22 (hereinafter referred to as "light transmitting material 22") on the main surface 12 of the base 10 (step S10), forming, from the light transmitting material 22, the arranged plurality of light transmitting layers 20 and the tilt prevention layer 40 disposed on the outer periphery of the region T in which the plurality of light transmitting layers 20 is disposed (step S20), and forming the light absorbing layer 30 among the plurality of light transmitting layers 20 (step S30).

Figure 5:
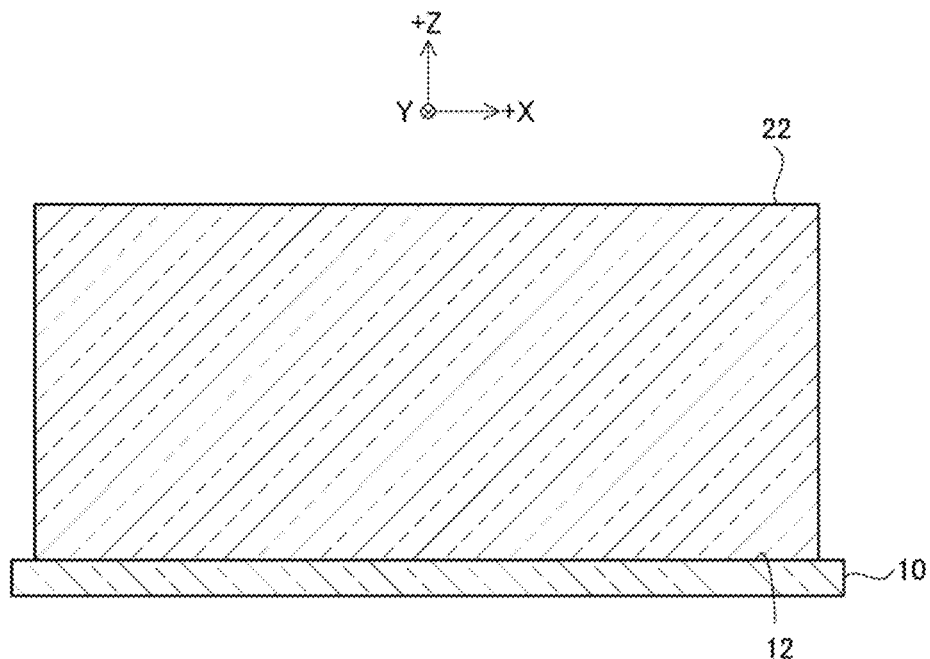
FIG. 5 is a schematic drawing illustrating a laminated photosensitive light transmitting material according to Embodiment 1.

In step S10, first, the base 10, and the light transmitting material 22 that forms the light transmitting layers 20 and the tilt prevention layer 40 are prepared. In the present embodiment, a flat plate-like glass substrate is prepared as the base 10. SU-8 is prepared as the light transmitting material 22. Next, as illustrated in FIG. 5, the light transmitting material 22 is laminated on the main surface 12 of the base 10. The light transmitting material 22 is laminated on the main surface 12 by spin coating, screen printing, spray coating, wire coating, or the like. The thickness of the light transmitting material 22, that is, the height H of the light transmitting layers 20, is from 10 μm to 600 μm, for example.

As illustrated in FIG. 4, step S20 includes pre-baking the laminated light transmitting material 22 (step S22), exposing the light transmitting material 22 to the predetermined pattern of the light transmitting layers 20 and the tilt prevention layer 40 (step S24), developing the exposed light transmitting material 22 (step S26), and post-baking the developed light transmitting material 22 (step S28).

In step S22, the laminated light transmitting material 22 is pre-baked (heated) in order to remove the solvent included in the laminated light transmitting material 22. In one example, the heating temperature is 95° C.

In step S24, a mask having an opening pattern of the light transmitting layers 20 and the tilt prevention layer 40 is used to expose the light transmitting material 22 to the predetermined pattern of the light transmitting layers 20 and the tilt prevention layer 40. In one example, the exposure light is ultraviolet light of a wavelength of 365 nm.

In step S26, the exposed light transmitting material 22 is developed in developer liquid. For the developing method, a shower method or a dip method may be used. The developability of the light transmitting material 22 is improved by rocking the base 10. After the developing, the developed light transmitting material 22 is rinsed using a rinsing liquid. The same methods described for the developing method may be used for the rinsing method.

Figure 6:
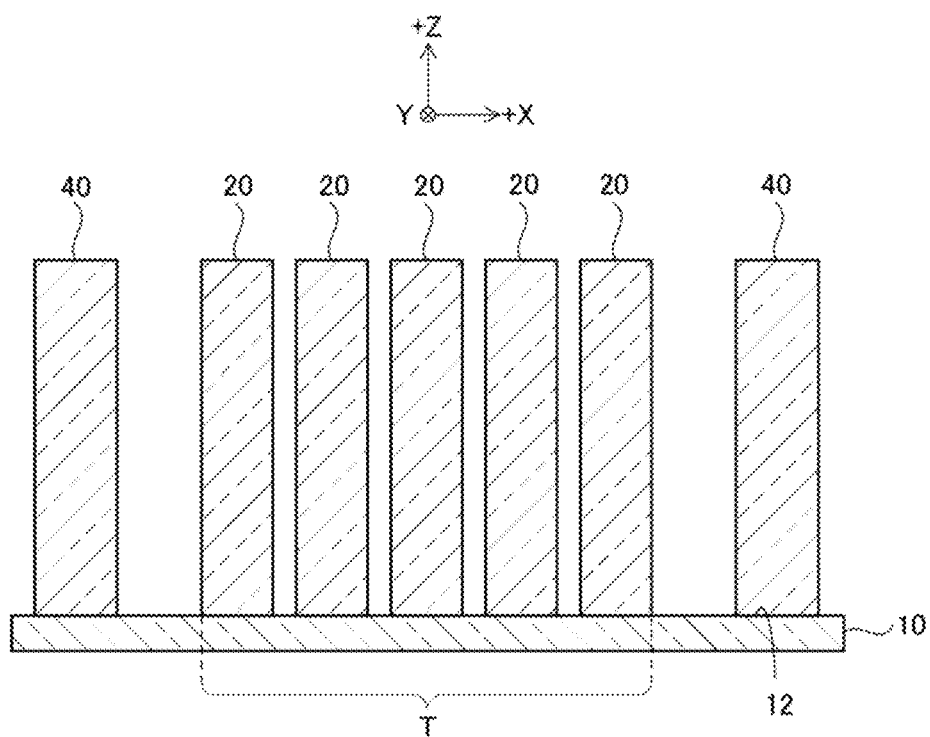
FIG. 6 is a schematic drawing illustrating formed light transmitting layers and a tilt prevention layer according to Embodiment 1.

In step S28, post-baking (heating) is performed in order to promote crosslinking of the light transmitting material 22. In one example, the heating temperature is 150° C. Thus, as illustrated in FIG. 6, the plurality of light transmitting layers 20 arranged in the predetermined pattern, and the tilt prevention layer 40 disposed on the outer periphery of the region T in which the light transmitting layers 20 are disposed are formed. In the present embodiment, the tilt prevention layer 40 and the light transmitting layers 20 are formed together and, as such, tilting of the light transmitting layers 20 can be suppressed.

In step S30, a black curable resin is filled among the light transmitting layers 20 and, then, the black curable resin is cured to form the light absorbing layer 30 among the light transmitting layers 20. Thus, the light ray direction control element 100 can be manufactured.

As described above, the tilt prevention layer 40 is disposed on the outer periphery of the region T in which the light transmitting layers 20 are disposed and, as such, the light ray direction control element 100 can suppress tilting of the light transmitting layers 20. Additionally, in the manufacturing method for the light ray direction control element 100, the tilt prevention layer 40, disposed on the outer periphery of the region T in which the light transmitting layers 20 are disposed, is formed together with the light transmitting layers 20 and, as such, tilting of the light transmitting layers 20 can be suppressed.

Embodiment 2

The tilt prevention layer 40 of Embodiment 1 is formed in a frame shape, but the tilt prevention layer 40 may have any shape.

Figure 7:
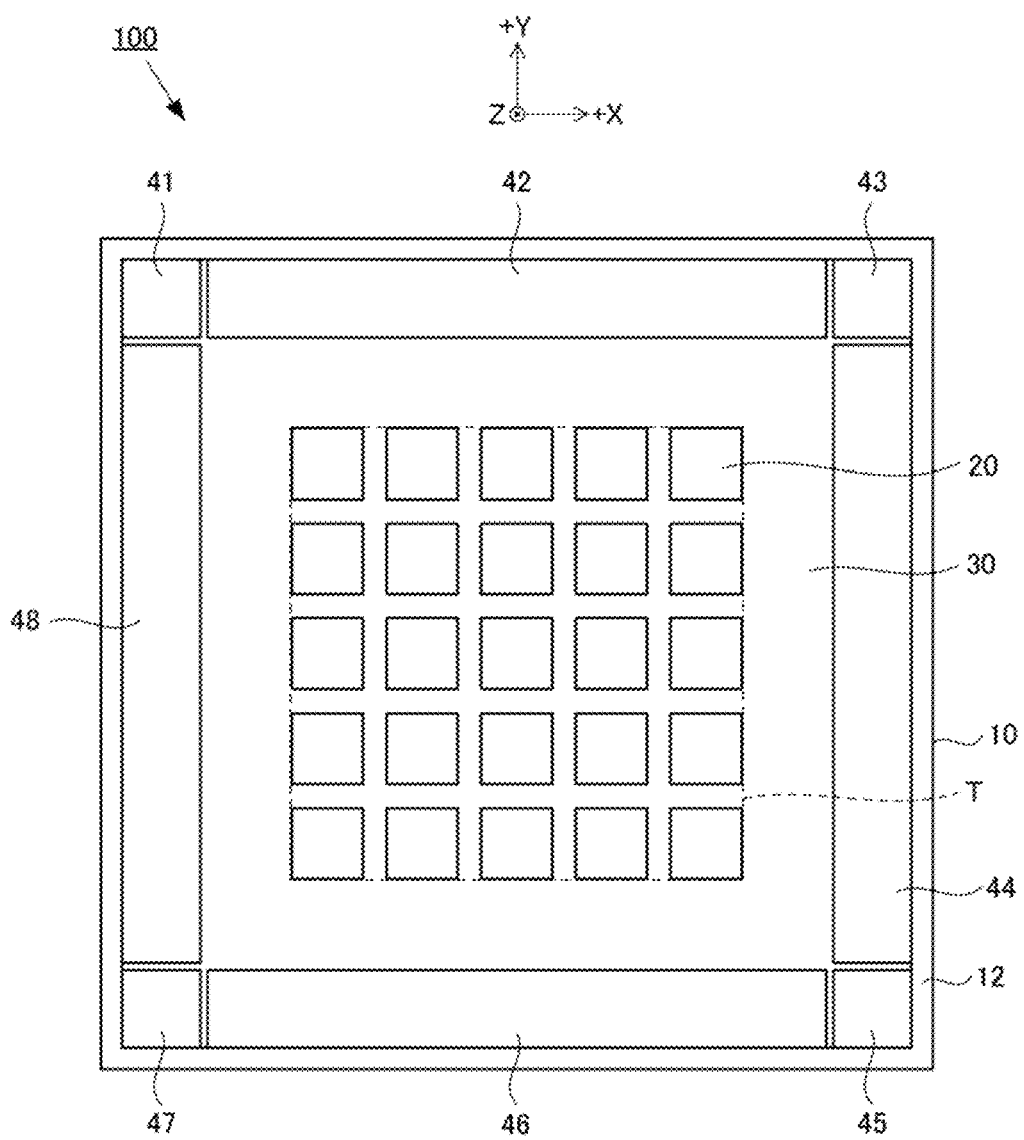
FIG. 7 is a schematic drawing illustrating an upper surface of a light ray direction control element according to Embodiment 2.

As illustrated in FIG. 7, the light ray direction control element 100 of the present embodiment includes a plurality of divided tilt prevention layers 41 to 48. The tilt prevention layers 41 to 48 each are formed in a rectangular shape. The tilt prevention layers 41 to 48 surround the outer periphery of the region T. The other configurations are the same as the configurations of the light ray direction control element 100 of Embodiment 1.

In the light ray direction control element 100 of the present embodiment as well, the tilt prevention layers 41 to 48 are disposed on the outer periphery of the region T in which the light transmitting layers 20 are disposed and, as such, tilting of light transmitting layers 20 can be suppressed. Additionally, in the manufacturing method for the light ray direction control element 100, circulation of the developer liquid can be facilitated, and developability can be improved. Furthermore, adhesion of the light transmitting layers 20 to the base 10 can be improved.

Embodiment 3

In Embodiment 1, a single tilt prevention layer 40 is disposed on the outer periphery of the region T. However, a plurality of tilt prevention layers 50 may be disposed facing the light transmitting layers 20.

Figure 8:
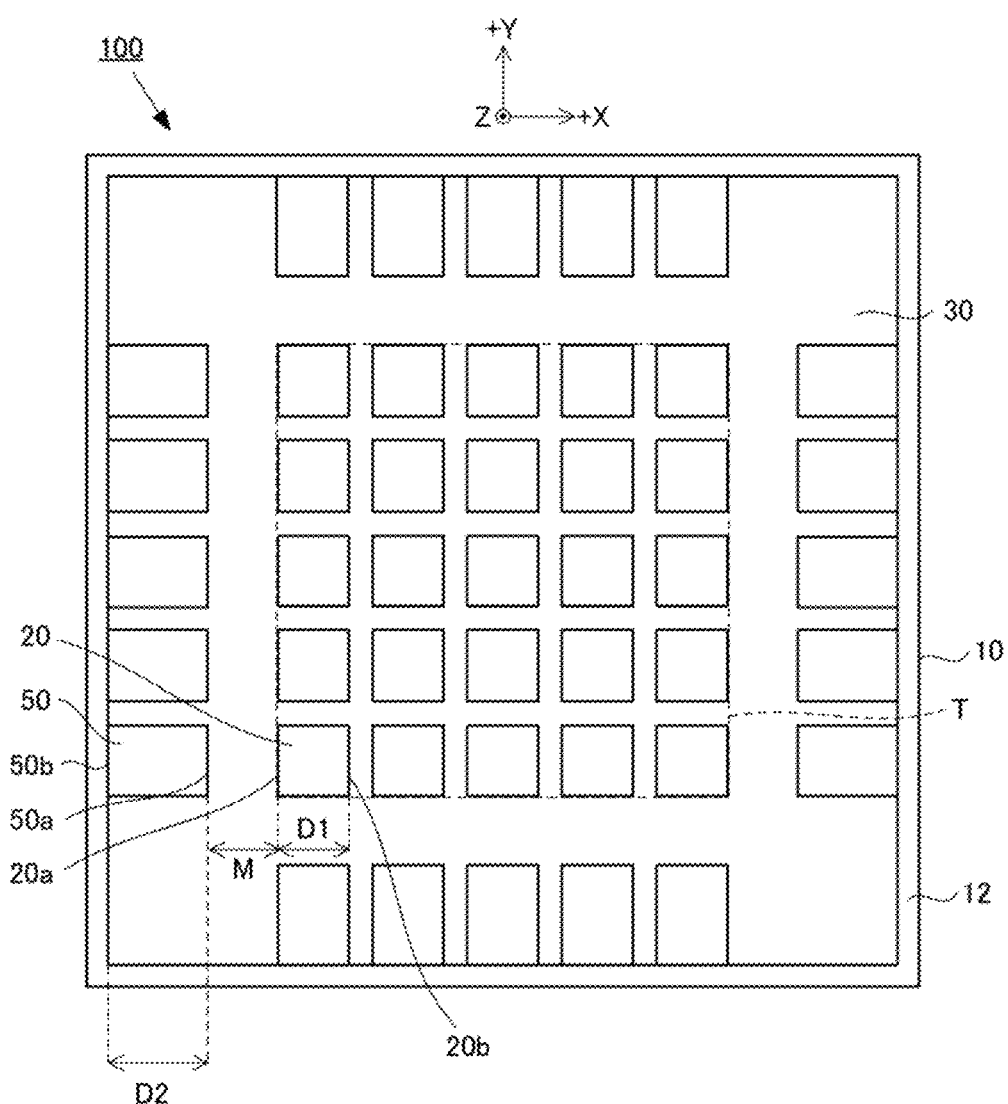
FIG. 8 is a schematic drawing illustrating an upper surface of a light ray direction control element according to Embodiment 3.

As illustrated in FIG. 8, the light ray direction control element 100 of the present embodiment includes a plurality of tilt prevention layers 50. The plurality of tilt prevention layer 50 is disposed on the outer periphery of the region T in which the light transmitting layers 20 are disposed, and surrounds the region T. Each of the tilt prevention layers 50 faces each of the light transmitting layers 20 disposed on the outermost periphery within the region T. The other configurations are the same as the configurations of the light ray direction control element 100 of Embodiment 1. Note that, in the present embodiment as well, the width D2 of one of the tilt prevention layers 50 (the width between a surface 50a of a tilt prevention layer 50 facing the light transmitting layers 20 and a surface 50b of a side of the tilt prevention layer 50 opposite the surface 50a facing the light transmitting layers 20) is preferably wider than the width D1 of one of the light transmitting layers 20.

In the light ray direction control element 100 of the present embodiment as well, the tilt prevention layers 50 are disposed on the outer periphery of the region T in which the light transmitting layers 20 are disposed and, as such, tilting of light transmitting layers 20 can be suppressed.

Embodiment 4

In Embodiment 3, a plurality of tilt prevention layers 50 is disposed facing the light transmitting layers 20 but, in a case in which the region T, in which the light transmitting layers 20 are disposed, is polygonal, tilt prevention layers 52 may be disposed at positions facing corners 62 of the region T.

Figure 9:
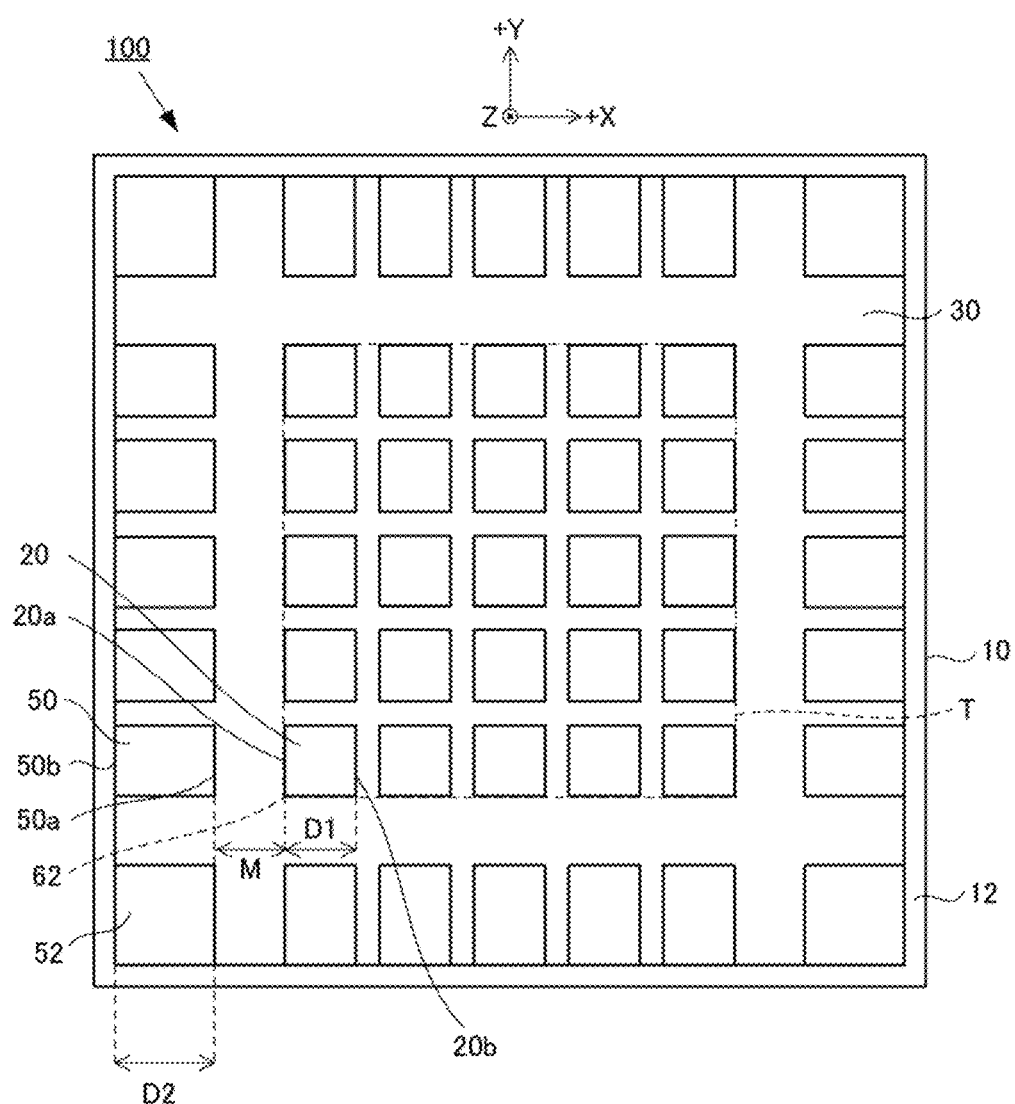
FIG. 9 is a schematic drawing illustrating an upper surface of a light ray direction control element according to Embodiment 4.

As illustrated in FIG. 9, with the light ray direction control element 100 of the present embodiment, the plurality of light transmitting layers 20 is arranged in a matrix within a rectangular region T. As with the tilt prevention layers 50 of Embodiment 3, each of the tilt prevention layers 50 is disposed facing each of the light transmitting layers 20 disposed on the outermost periphery within the region T. Furthermore, the tilt prevention layers 52 are disposed on the outer periphery of the region T, at positions facing the corners 62 of the region T. The other configurations are the same as the configurations of the light ray direction control element 100 of Embodiment 3.

In the present embodiment as well, the tilt prevention layers 50 are disposed on the outer periphery of the region T in which the light transmitting layers 20 are disposed and, as such, tilting of light transmitting layers 20 can be suppressed. Additionally, the tilt prevention layers 52 face the corners 62 of the region T and, as such, tilting of the light transmitting layers 20 disposed in the proximity of the corners 62 of the region T can be further suppressed.

Embodiment 5

In Embodiment 3, a plurality of tilt prevention layers 50 is disposed facing the light transmitting layers 20, but the tilt prevention layers 50 may be connected to each other.

Figure 10:
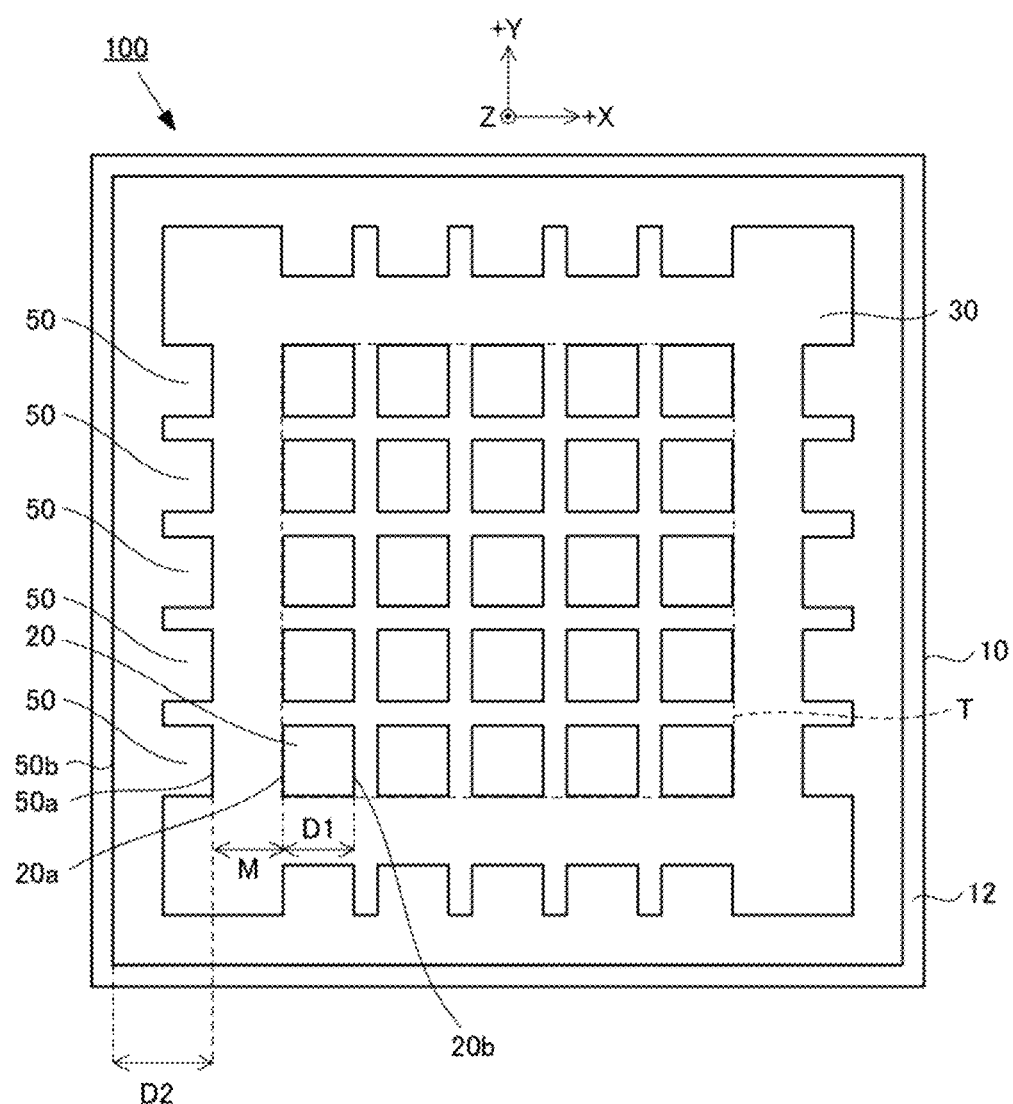
FIG. 10 is a schematic drawing illustrating an upper surface of a light ray direction control element according to Embodiment 5.

With the light ray direction control element 100 of the present embodiment, as with the tilt prevention layers 50 of Embodiment 3, each of the tilt prevention layers 50 is disposed facing each of the light transmitting layers 20 disposed on the outermost periphery within the region T. Furthermore, as illustrated in FIG. 10, ends of the tilt prevention layers 50 on sides opposite the light transmitting layers 20 are connected to each other. The other configurations are the same as the configurations of the light ray direction control element 100 of Embodiment 3.

In the present embodiment as well, the tilt prevention layers 50 are disposed on the outer periphery of the region T in which the light transmitting layers 20 are disposed and, as such, tilting of light transmitting layers 20 can be suppressed. Furthermore, since the tilt prevention layers 50 are connected to each other, tilting of the tilt prevention layers 50 can be suppressed.

Embodiment 6

With the light ray direction control elements 100 of Embodiments 1 to 5, the base 10 is implemented as a light transmitting substrate, but the base 10 is not limited to a light transmitting substrate.

Figure 11:
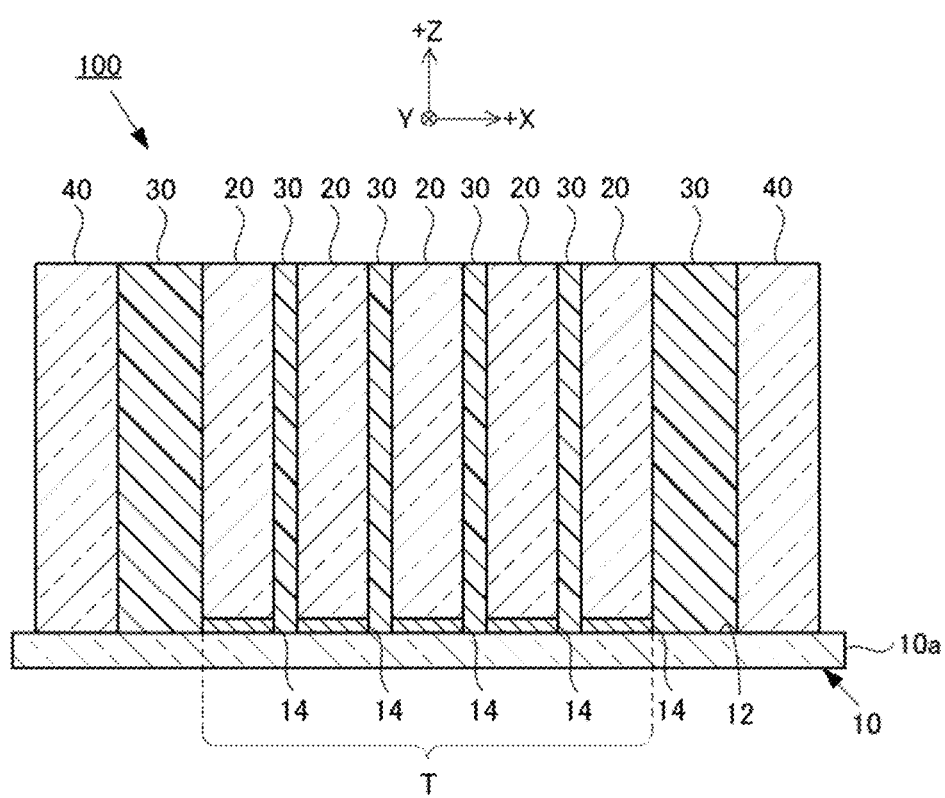
FIG. 11 is a schematic drawing illustrating a light ray direction control element according to Embodiment 6.

In the present embodiment, the base 10 is implemented as an imaging element. In one example, the imaging element is a charge coupled device (CCD) image sensor. As illustrated in FIG. 11, the base 10 includes a substrate 10a and a plurality of light receivers 14. The plurality of light receivers 14 is arranged on the main surface 12, and receive light from an imaging target.

In the present embodiment, the light transmitting layers 20 are positioned on the light receivers 14 of the base 10. Additionally, the light absorbing layer 30 is positioned among the light transmitting layers 20. The other configurations of the light ray direction control element 100 of the present embodiment are the same as the light ray direction control element 100 of Embodiment 1.

In the present embodiment, the light absorbing layer 30 removes the light that enters the light receivers 14 from extra angles and, as such, clear images can be captured. Additionally, in the present embodiment as well, the tilt prevention layer 40 is disposed on the outer periphery of the region T in which the light transmitting layers 20 are disposed and, as such, tilting of light transmitting layers 20 can be suppressed. The light ray direction control element 100 of the present embodiment can, for example, also be described as an imaging element that includes a substrate 10a, a plurality of light receivers 14 that is arranged on a main surface 12 of the substrate 10a and that receives light from an imaging target, light transmitting layers 20 disposed on the light receivers 14, a light absorbing layer 30 disposed among the light transmitting layers 20, and a tilt prevention layer 40 disposed on an outer periphery of a region T in which the light transmitting layers 20 are disposed.

Modified Examples

Embodiments have been described, but various modifications can be made to the present disclosure without departing from the spirit and scope of the present disclosure.

The bases 10 of Embodiments 1 to 5 are implemented as flat plate-like glass substrates, but the base 10 may be formed from a light transmitting resin.

The light transmitting layers 20 of Embodiments 1 to 5 are arranged in a matrix, but the arrangement of the light transmitting layers 20 is not limited. For example, the light transmitting layers 20 may be arranged in a staggered manner. In Embodiment 6, the light transmitting layers 20 are arranged in correspondence with the arrangement of the light receivers 14. Furthermore, in Embodiments 1 to 6, the light transmitting layers 20 have a rectangular pillar shape, but the shape of the light transmitting layers 20 is not limited. For example, the light transmitting layers 20 may have a cylindrical shape.

The shape of the region T in which the light transmitting layers 20 are disposed is not limited. The regions T of Embodiments 1 and 2 are rectangular, but the region T may be polygonal, circular, or the like.

The light transmitting material 22 forming the light transmitting layers 20 and the tilt prevention layer 40 is not limited to SU-8, and any material that is photosensitive and transmits light may be used. The exposure of the light transmitting material 22 may be proximity exposure in which a gap is provided between the light transmitting material 22 and the mask, or may be contact exposure in which the light transmitting material 22 and the mask are in contact with each other.

In the exposing of the light transmitting material 22 to the predetermined pattern of the light transmitting layers 20 and the tilt prevention layer 40 (step S24), a post-exposure bake (PEB) process may be carried out after exposing the light transmitting material 22.

Figure 12:
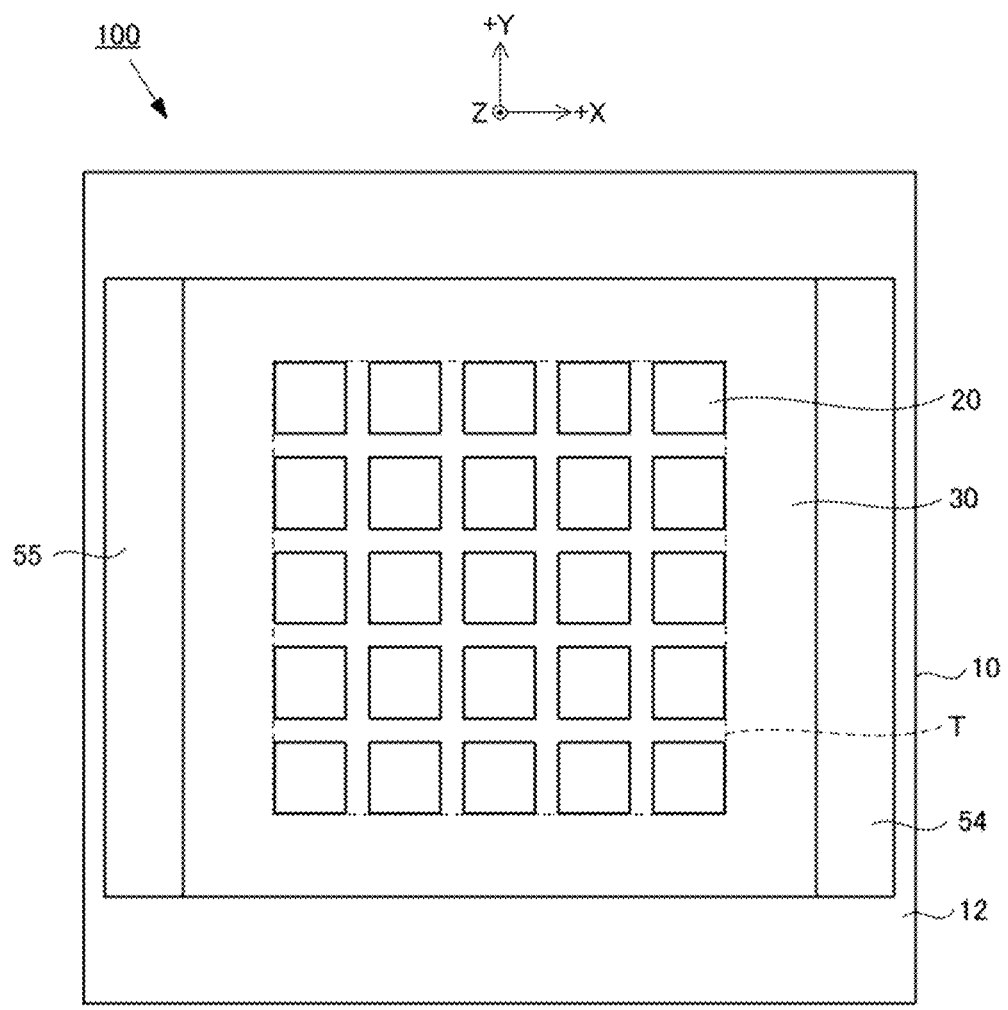
FIG. 12 is a schematic drawing illustrating a tilt prevention layer according to a modified example.

The tilt prevention layers 40, 41 to 48, 50, and 52 surround the outer periphery of the region T, but any arrangement may be used provided that one or a plurality of tilt prevention layers is disposed on the outer periphery of the region T. As illustrated in FIG. 12, a configuration is possible in which two tilt prevention layers 54, 55 that face each other are disposed on the outer periphery of the region T so as to sandwich the region T.

Figure 13:
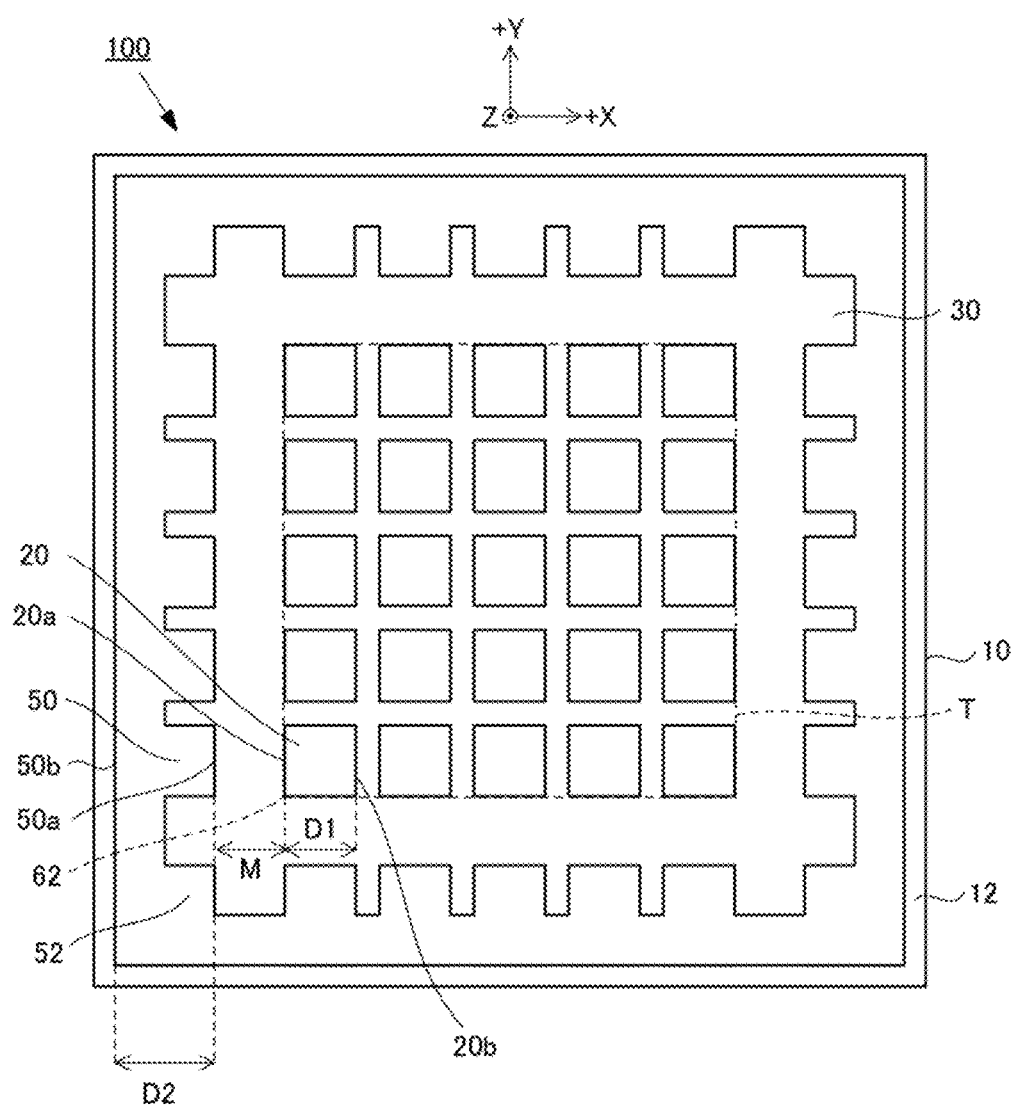
FIG. 13 is a schematic drawing illustrating a tilt prevention layer according to a modified example.

The tilt prevention layers 52 of Embodiment 4 are disposed facing the corners 62 of the rectangular region T. In a case in which the region T has a polygonal shape, the tilt prevention layers 52 may be disposed facing corners of the polygonal shape. Additionally, as illustrated in FIG. 13, the tilt prevention layers 50, 52 of Embodiment 4 may be connected to each other.

The black curable resin that forms the light absorbing layer 30 may be a thermosetting resin or may be an ultraviolet (UV) curable resin.

The light transmitting layers 20 of Embodiment 6 are formed directly on the light receivers 14, but a configuration is possible in which another member is provided between the light transmitting layers 20 and the light receivers 14. For example, a protection layer that protects the light receivers 14 may be provided directly on the light receivers 14, and the light transmitting layers 20 may be provided on the protection layer. Furthermore, the imaging element is not limited to a CCD image sensor. For example, the imaging element may be a complementary metal oxide semiconductor (CMOS) image sensor.

Figure 14:
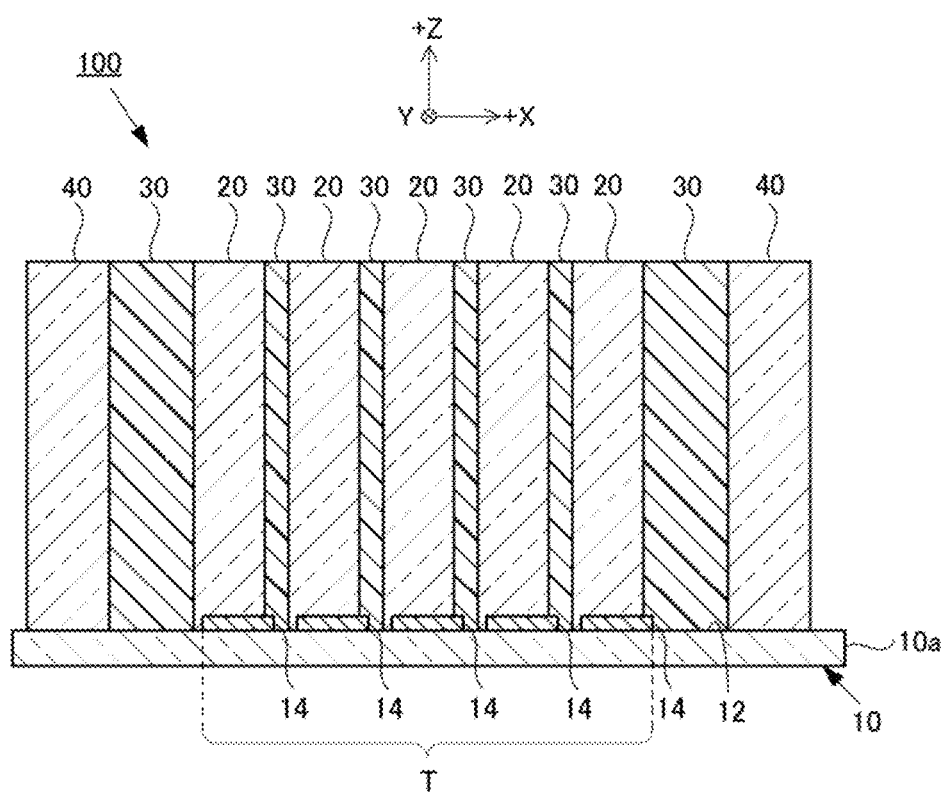
FIG. 14 is a schematic drawing illustrating a light ray direction control element according to a modified example.

It is sufficient that the light transmitting layers 20 of Embodiment 6 are disposed on at least portions of the light receivers 14. As illustrated in FIG. 14, the light transmitting layers 20 may be disposed on portions of the light receivers 14. Additionally, the light transmitting layers 20 may be disposed at positions that overlap portions of the light receivers 14 when viewed from above.

Preferred embodiments of the present disclosure have been described, but the present disclosure should not be construed as being limited to these specific embodiments. The scope of the invention is defined only by the included claims, along with the full range of equivalents to which such claims are entitled.

EXAMPLES

Hereinafter, the present disclosure is described in detail using examples, but the present disclosure is not limited to these examples.

Example 1

In the present example, the base 10 was implemented as a flat plate-like glass substrate, and the light transmitting layers 20 and the tilt prevention layer 40 of Embodiment 1 were formed on the main surface 12 of the base 10. In the present example, the size of the region T in which the light transmitting layers 20 are disposed was set to 30 mm×30 mm, and the shape of the light transmitting layers 20 was set to a square pillar. The width D1 of the light transmitting layers 20 was set to 50 μm, the height H of the light transmitting layers 20 was set to 400 μm, and the array pitch of the light transmitting layers 20 was set to 100 μm. The width D2 of the tilt prevention layer 40 was set to 250 μm, the height of the tilt prevention layer 40 was set to 400 μm, and the gap M between the tilt prevention layer 40 and the region T was set to 150 μm.

The light transmitting layers 20 and the tilt prevention layer 40 were formed in accordance with step S10 and step S20 (step S22 to step S28) of the manufacturing method for the light ray direction control element 100.

As a comparative example in which the tilt prevention layer 40 is not provided, only the light transmitting layers 20 of the present example were formed on the main surface 12 of the base 10.

Figure 15:
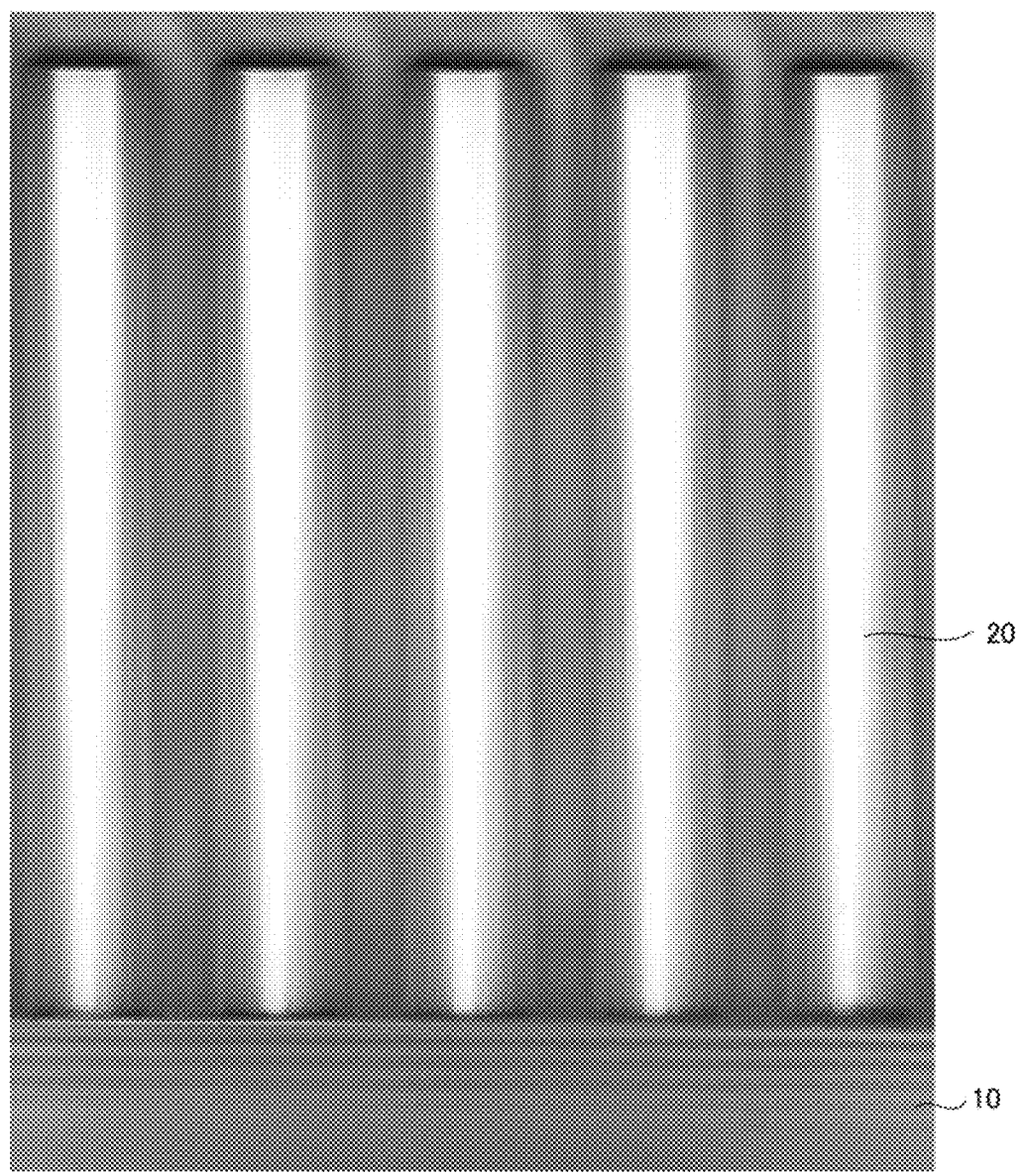
FIG. 15 is a photograph illustrating the light transmitting layers of a center section according to Example 1.
Figure 16:
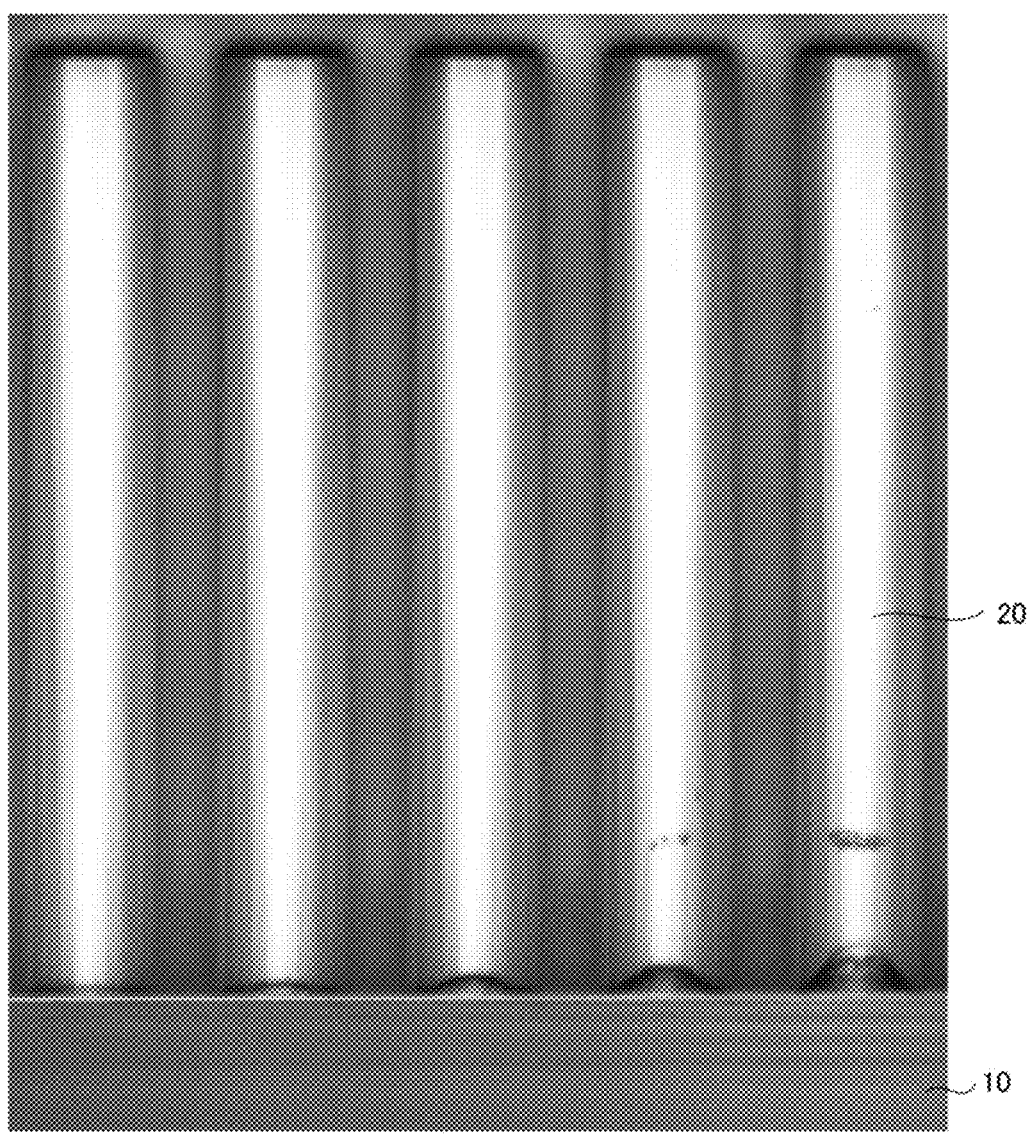
FIG. 16 is a photograph illustrating the light transmitting layers of a +X direction end section according to Example 1.
Figure 17:
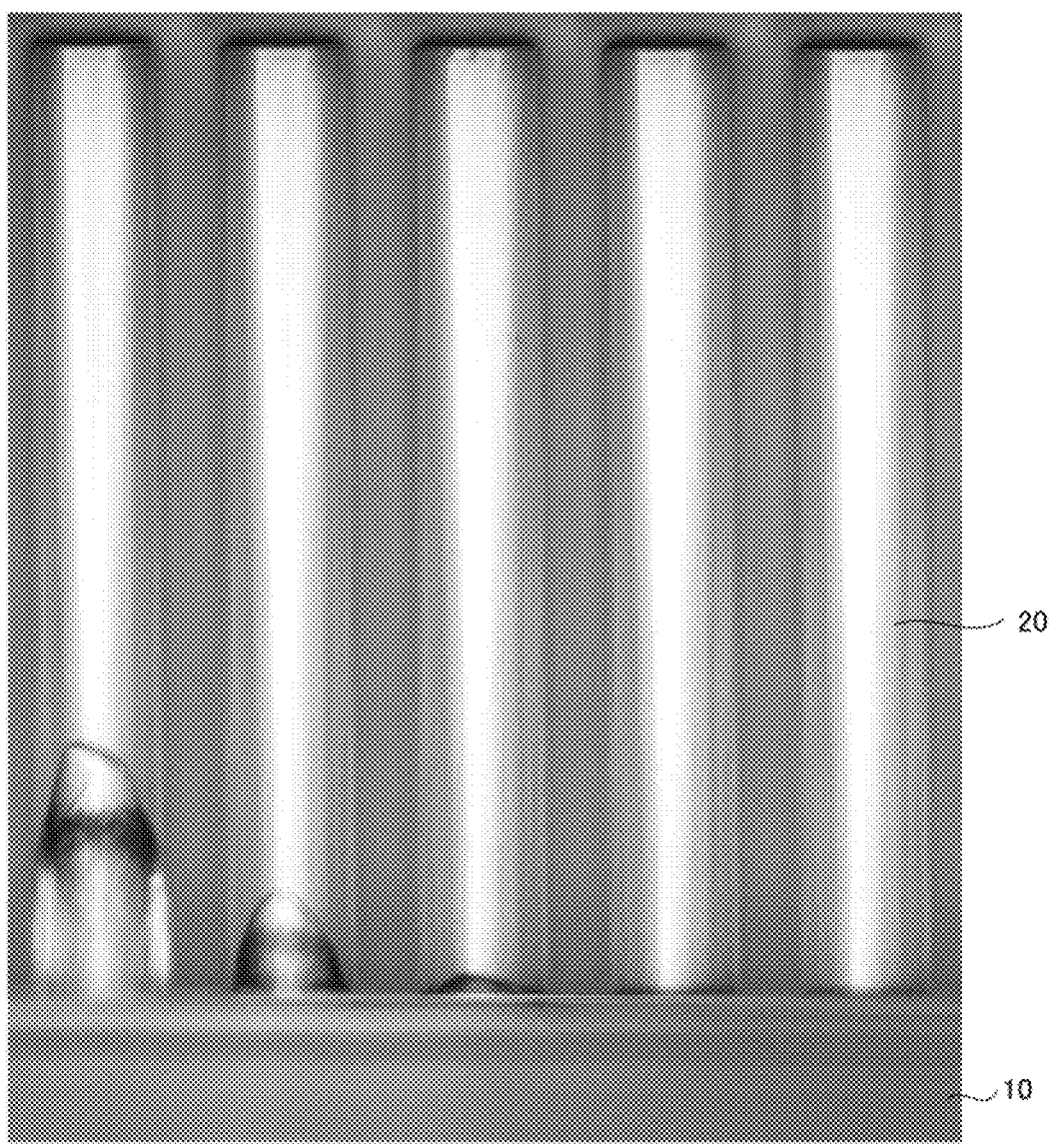
FIG. 17 is a photograph illustrating the light transmitting layers of a −X direction end section according to Example 1.
Figure 18:
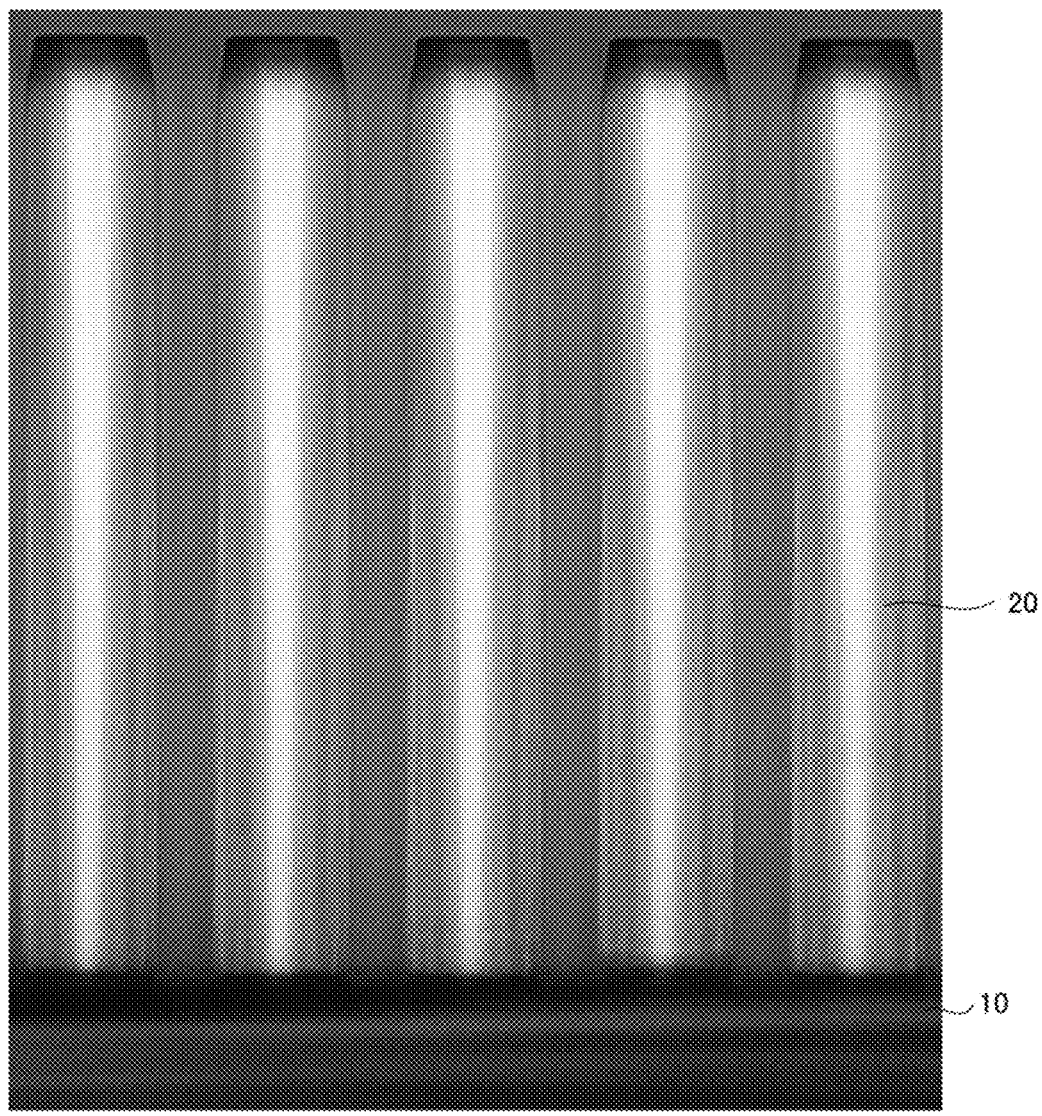
FIG. 18 is a photograph illustrating the light transmitting layers of a center section according to a comparative example.
Figure 19:
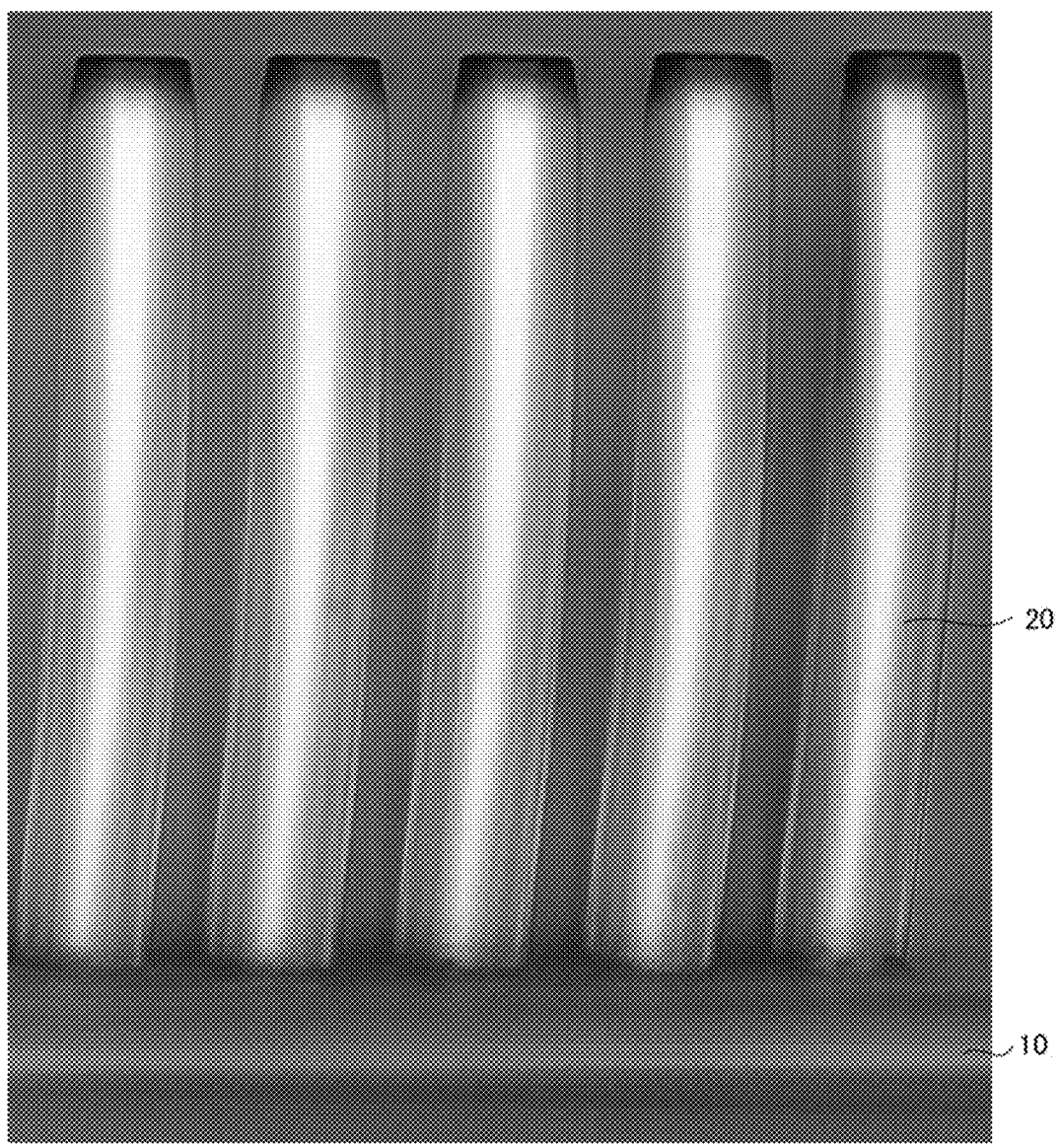
FIG. 19 is a photograph illustrating the light transmitting layers of a +X direction end section according to the comparative example.
Figure 20:
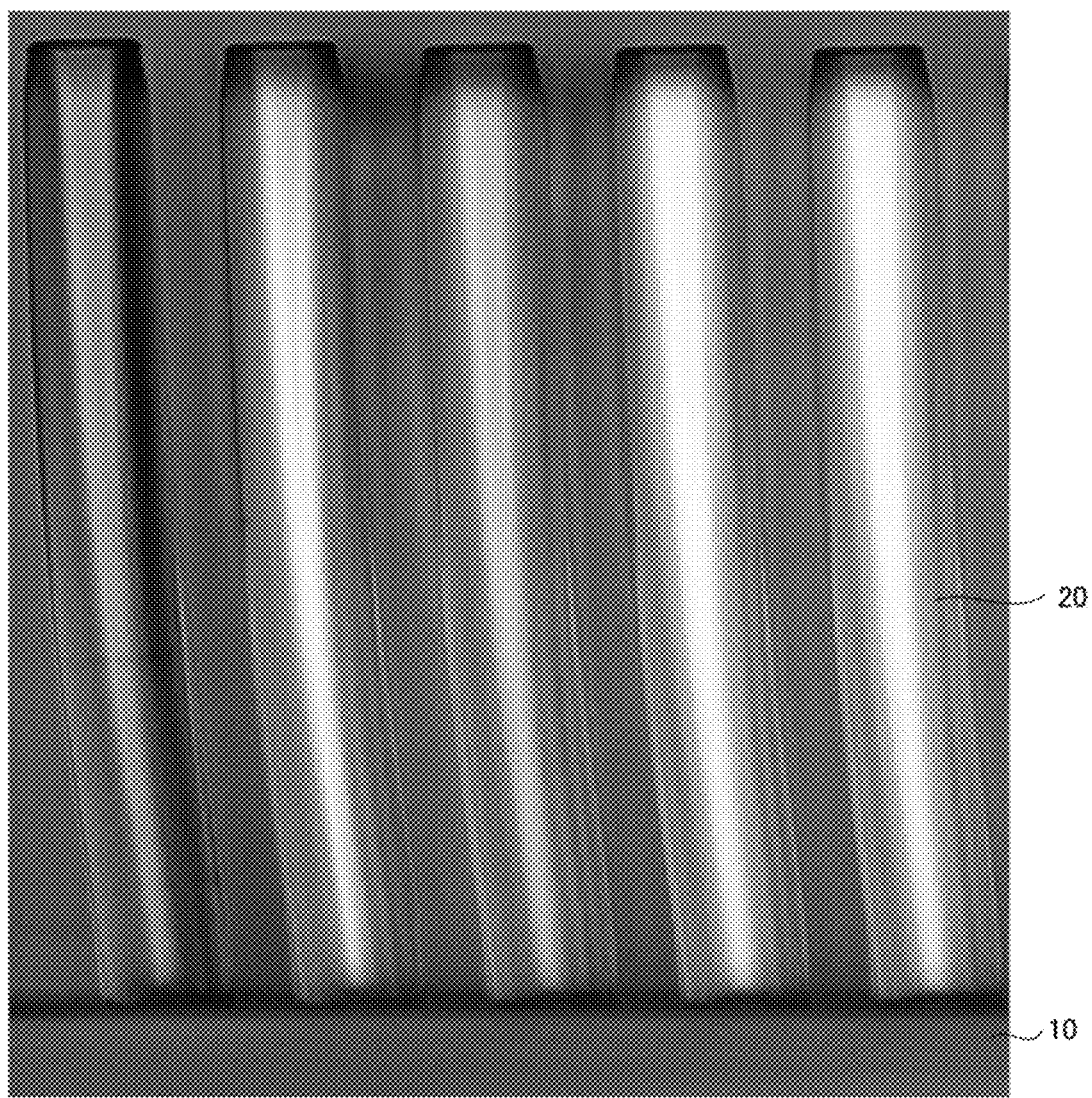
FIG. 20 is a photograph illustrating the light transmitting layers of a −X direction end section according to the comparative example.

FIGS. 15, 16, and 17 respectively illustrate the light transmitting layers 20 of the center section, the light transmitting layers 20 of the +X direction end section, and the light transmitting layers 20 of the −X direction end section of the region T formed in the present example. FIGS. 18, 19, and 20 respectively illustrate the light transmitting layers 20 of the center section, the light transmitting layers 20 of the +X direction end section, and the light transmitting layers 20 of the −X direction end section of the region T formed in the comparative example. Note that the chips in portions of the light transmitting layers 20 in FIGS. 15 to 20 are chips that occurred when breaking to fabricate the photographing samples.

As illustrated in FIGS. 15 to 17, the light transmitting layers 20 formed in the present example are not tilted. However, as illustrated in FIGS. 19 and 20, the −X direction end section and the +X direction end section of the light transmitting layers 20 formed in the comparative example are tilted toward the outside of the region T.

As described above, the tilt prevention layer 40 is disposed on the outer periphery of the region T in which the light transmitting layers 20 are disposed and, as such, tilting of the light transmitting layers 20 can be suppressed.

Example 2, Example 3

As in Example 1, the light transmitting layers 20 and the tilt prevention layer 40 of Embodiment 1 were formed on the main surface 12 of the base 10. The height H of the light transmitting layers 20 and the height of the tilt prevention layer 40 were set to 350 μm, and the width D2 of the tilt prevention layer 40 was set to 250 μm (Example 2) and 450 μm (Example 3). The other configurations were the same as in Example 1.

Figure 21:
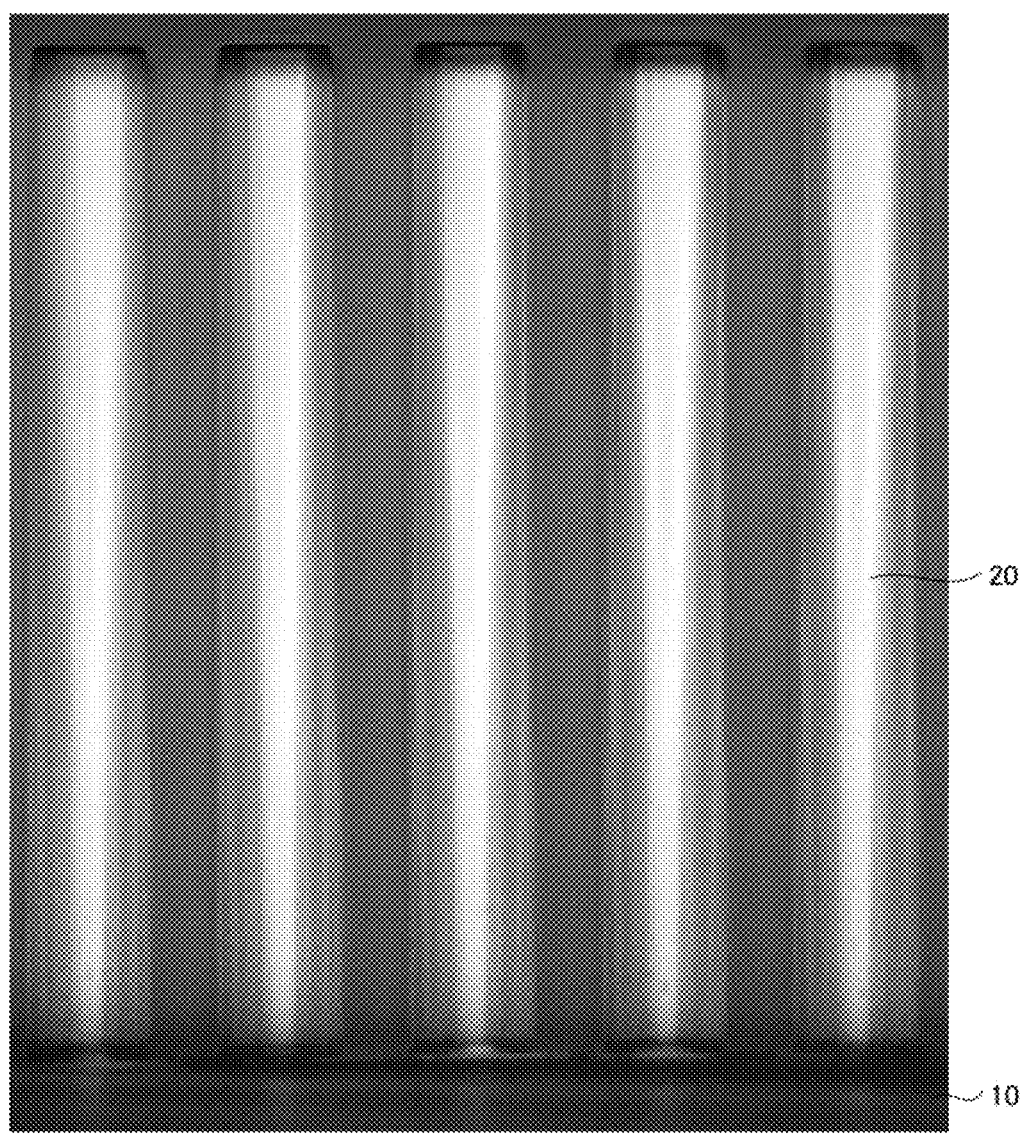
FIG. 21 is a photograph illustrating the light transmitting layers of a +X direction end section according to Example 2.
Figure 22:
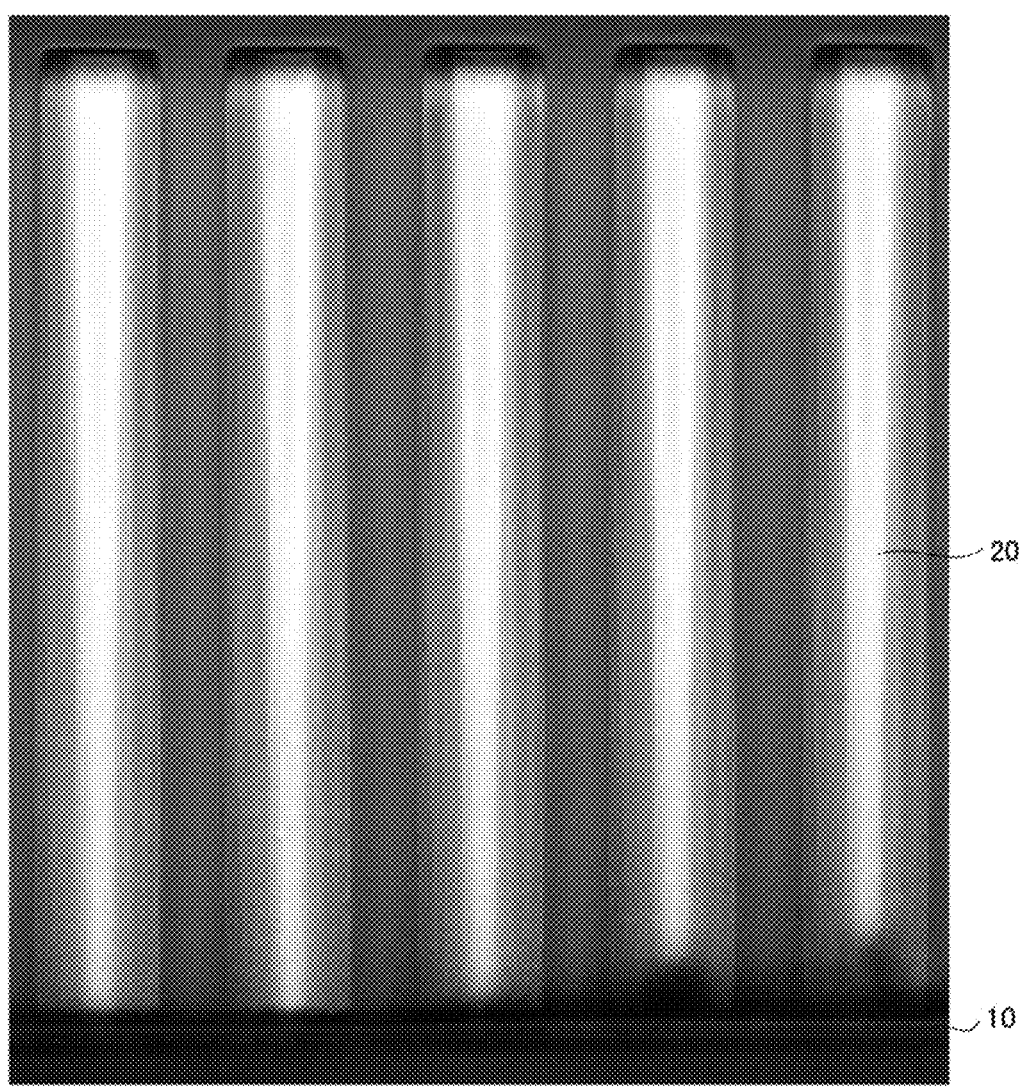
FIG. 22 is a photograph illustrating the light transmitting layers of a +X direction end section according to Example 3.

FIG. 21 illustrates the light transmitting layers 20 of the +X direction end section of Example 2, and FIG. 22 illustrates the light transmitting layers 20 of the +X direction end section of Example 3. As illustrated in FIGS. 21 and 22, the light transmitting layers 20 formed in Examples 2 and 3 are not tilted. Therefore, it is possible to suppress tilting of the light transmitting layers 20 by disposing the tilt prevention layer 40 on the outer periphery of the region T.

Example 4

In the present example, the base 10 was implemented as a flat plate-like glass substrate, and the light transmitting layers 20 and the tilt prevention layers 50, 52 of Embodiment 4 were formed on the main surface 12 of the base 10. In the present example, the size of the region T in which the light transmitting layers 20 are disposed was set to 30 mm×30 mm, and the shape of the light transmitting layers 20 was set to a square pillar. The width D1 of the light transmitting layers 20 was set to 50 μm, the height H of the light transmitting layers 20 was set to 400 μm, and the array pitch of the light transmitting layers 20 was set to 100 μm. The width D2 of the tilt prevention layers 50, 52 was set to 250 μm, the height of the tilt prevention layers 50, 52 was set to 400 μm, and the gap M between the tilt prevention layers 50 and the region T was set to 50 μm. The light transmitting layers 20 and the tilt prevention layers 50, 52 were formed in accordance with step S10 and step S20 of the manufacturing method for the light ray direction control element 100.

Figure 23:
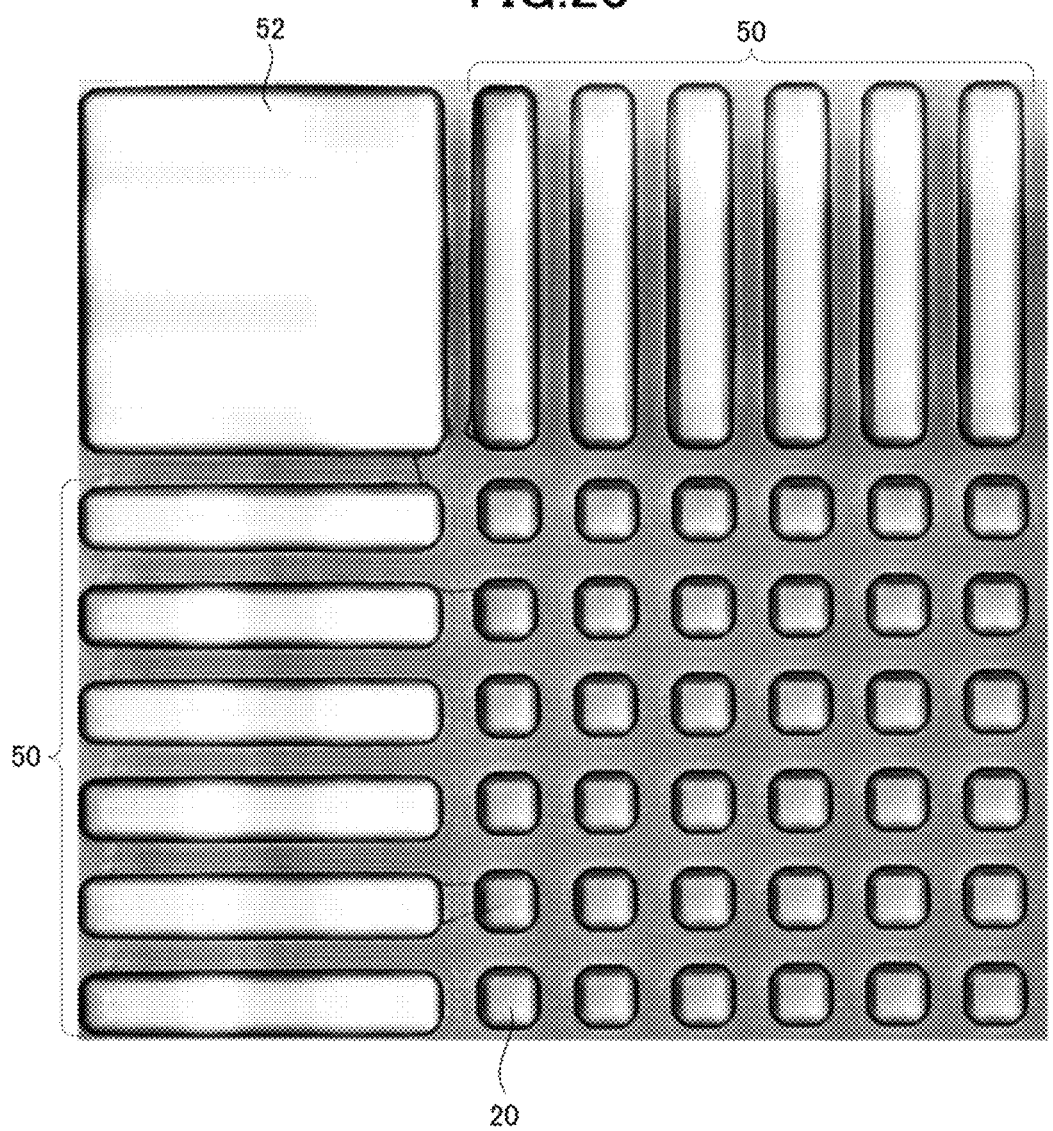
FIG. 23 is a photograph illustrating light transmitting layers and tilt prevention layers according to Example 4.

FIG. 23 illustrates the light transmitting layers 20 and the tilt prevention layers 50, 52 of the present example. As illustrated in FIG. 23, the light transmitting layers 20 are not tilted.

As described above, each of the tilt prevention layers 50 disposed on the outer periphery of the region T faces each of the light transmitting layers 20 disposed on the outermost periphery within the region T. As such it is possible to suppress tilting of the light transmitting layers 20. Additionally, the tilt prevention layer 52 faces the corner 62 of the region T and, as such, tilting of the light transmitting layers 20 disposed in the proximity of the corner 62 can be further suppressed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A light ray direction control element, comprising:
   a base;
   a plurality of light transmitting layers arranged on a main surface of the base;
   a light absorbing layer disposed among the plurality of light transmitting layers; and
   a plurality of tilt prevention layers provided on the main surface of the base and disposed on an outer periphery of a region in which the plurality of light transmitting layers is disposed, wherein
   the light absorbing layer is disposed between the plurality of light transmitting layers and the plurality of tilt prevention layers,
   a gap between the region in which the plurality of light transmitting layers is disposed and the plurality of tilt prevention layers is greater than a width of the light absorbing layer, and
   the plurality of tilt prevention layers are disposed facing the plurality of light transmitting layers disposed on an outermost periphery in a one-to-one correspondence.

2. The light ray direction control element according to claim 1, wherein the plurality of tilt prevention layers are connected to each other.

3. The light ray direction control element according to claim 1, wherein the plurality of tilt prevention layers surround the region in which the plurality of light transmitting layers are disposed.

4. The light ray direction control element according to claim 1, wherein the plurality of tilt prevention layers have a width that is wider than a width of one of the light transmitting layers.

5. The light ray direction control element according to claim 1, wherein the plurality of light transmitting layers have a pillar shape.

6. The light ray direction control element according to claim 1, wherein the base is a light transmitting substrate.

7. The light ray direction control element according to claim 1, wherein the base is an imaging element.

8. The light ray direction control element according to claim 1, wherein the gap between the region in which the plurality of light transmitting layers is disposed and the plurality of tilt prevention layers is greater than the width of each of the plurality of light transmitting layers.

9. A manufacturing method for a light ray direction control element, comprising:
   laminating, on a main surface of a base, a photosensitive light transmitting material;
   forming, from the light transmitting material, an arranged plurality of light transmitting layers, and a plurality of tilt prevention layers disposed on an outer periphery of a region in which the plurality of light transmitting layers is disposed; and
   forming a light absorbing layer among the plurality of light transmitting layers by filling a resin having light absorbency among the plurality of light transmitting layers and curing the resin filled among the plurality of light transmitting layers, wherein
   the plurality of tilt prevention layers are disposed facing the plurality of light transmitting layers disposed on an outermost periphery in a one-to-one correspondence.

10. The manufacturing method according to claim 9, wherein a gap between the region in which the plurality of light transmitting layers is disposed and the plurality of tilt prevention layers is greater than a width of each of the plurality of light transmitting layers.

11. An imaging element, comprising:
    a substrate;
    a plurality of light receivers that is arranged on a main surface of the substrate and that receives light from an imaging subject;
    a light transmitting layer disposed on each of the plurality of light receivers;
    a light absorbing layer disposed among the light transmitting layers; and
    a plurality of tilt prevention layers provided on the main surface of the substrate and disposed on an outer periphery of a region in which the light transmitting layers are disposed, wherein
    a gap between the region in which the plurality of light transmitting layers is disposed and the plurality of tilt prevention layers is greater than a width of the light absorbing layer, and
    the plurality of tilt prevention layers are disposed facing the plurality of light transmitting layers disposed on an outermost periphery in a one-to-one correspondence.

12. The imaging element according to claims 11, wherein the plurality of light transmitting layers are disposed at positions that partially overlap the light receivers.

* * * * *